(12) United States Patent
Groenhuis et al.

(10) Patent No.: US 9,418,919 B2
(45) Date of Patent: Aug. 16, 2016

(54) LEADLESS CHIP CARRIER HAVING IMPROVED MOUNTABILITY

(75) Inventors: Roelf Anco Jacob Groenhuis, Nijmegen (NL); Markus Björn Erik Noren, Hamburg (DE); Fei-ying Wong, Tung Chung (HK); Hei-ming Shiu, Hong Kong (HK)

(73) Assignee: NXP B.V., Eindhoven (NL)

( * ) Notice: Subject to any disclaimer, the term of this patent is extended or adjusted under 35 U.S.C. 154(b) by 73 days.

(21) Appl. No.: 13/007,538

(22) Filed: Jan. 14, 2011

(65) Prior Publication Data

US 2012/0181678 A1 Jul. 19, 2012

Related U.S. Application Data

(60) Provisional application No. 61/368,826, filed on Jul. 29, 2010.

(51) Int. Cl.
*H01L 23/495* (2006.01)
*H01L 21/66* (2006.01)
(Continued)

(52) U.S. Cl.
CPC ...... *H01L 23/49562* (2013.01); *H01L 21/4842* (2013.01); *H01L 21/561* (2013.01); *H01L 21/568* (2013.01); *H01L 23/49548* (2013.01); *H01L 23/49582* (2013.01); *H01L 24/48* (2013.01); *H01L 24/97* (2013.01); *H01L 23/3107* (2013.01); *H01L 24/29* (2013.01); *H01L 24/45* (2013.01); *H01L 24/73* (2013.01); *H01L 24/83* (2013.01); *H01L 24/85* (2013.01); *H01L 2224/2919* (2013.01); *H01L 2224/32245* (2013.01); *H01L 2224/45144* (2013.01); *H01L 2224/48095* (2013.01); *H01L 2224/48247* (2013.01); *H01L 2224/48471* (2013.01); *H01L 2224/48479* (2013.01); *H01L 2224/48599* (2013.01); *H01L 2224/73265* (2013.01); *H01L 2224/83805* (2013.01); *H01L 2224/83855* (2013.01); *H01L 2224/83913* (2013.01); *H01L 2224/85913* (2013.01); *H01L 2224/97* (2013.01); *H01L 2924/014* (2013.01); *H01L 2924/0105* (2013.01); *H01L 2924/01014* (2013.01); *H01L 2924/01029* (2013.01); *H01L 2924/01033* (2013.01); *H01L 2924/01079* (2013.01);
(Continued)

(58) Field of Classification Search
CPC .............................. H01L 23/48; H01L 23/495
USPC ...................... 257/676, 773, E23.031, E23.01
See application file for complete search history.

(56) References Cited

U.S. PATENT DOCUMENTS 4,991,059 A * 2/1991 Kiyose .......................... 361/773
5,977,630 A * 11/1999 Woodworth et al. ......... 257/712
(Continued)

FOREIGN PATENT DOCUMENTS

CN           1591853 A      3/2005
CN         101336044 A     12/2008
(Continued)

*Primary Examiner* — Peniel M Gumedzoe

(57) ABSTRACT

Consistent with an example embodiment, there is surface-mountable non-leaded chip carrier for a semiconductor device. The device comprises a first contact. A second contact is relative to the first contact; the second contact has a split therein to provide first and second portions of the second contact arranged relative to one another to lessen tilting of a soldering condition involving attachment of the chip carrier to a printed circuit board.

15 Claims, 8 Drawing Sheets

(51) Int. Cl.
  *H01L 23/48* (2006.01)
  *H01L 21/48* (2006.01)
  *H01L 21/56* (2006.01)
  *H01L 23/00* (2006.01)
  *H01L 23/31* (2006.01)

(52) U.S. Cl.
  CPC ........... *H01L2924/01082* (2013.01); *H01L 2924/01322* (2013.01); *H01L 2924/10253* (2013.01); *H01L 2924/10329* (2013.01); *H01L 2924/1305* (2013.01); *H01L 2924/13091* (2013.01)

(56) References Cited

U.S. PATENT DOCUMENTS

| | | | |
|---|---|---|---|
| 6,187,614 B1 * | 2/2001 | Takata et al. | 438/112 |
| 6,229,223 B1 | 5/2001 | Watanabe | |
| 6,593,526 B2 * | 7/2003 | Takeda | 174/535 |
| 6,603,148 B1 * | 8/2003 | Sano et al. | 257/98 |
| 6,756,658 B1 * | 6/2004 | Gillett et al. | 257/666 |
| 6,794,762 B2 * | 9/2004 | Ikegami et al. | 257/787 |
| 6,911,353 B2 * | 6/2005 | Tani et al. | 438/68 |
| 7,166,919 B2 | 1/2007 | Tabira | |
| 7,315,077 B2 | 1/2008 | Choi et al. | |
| 7,397,112 B2 * | 7/2008 | Sato et al. | 257/666 |
| 7,675,172 B2 | 3/2010 | Takizawa et al. | |
| 7,755,199 B2 | 7/2010 | Wu | |
| 8,319,319 B2 | 11/2012 | Jang | |
| 2005/0017335 A1 * | 1/2005 | Tabira | 257/678 |
| 2005/0139968 A1 * | 6/2005 | Yap et al. | 257/666 |
| 2006/0189029 A1 * | 8/2006 | Koduri et al. | 438/106 |
| 2007/0029572 A1 * | 2/2007 | Han et al. | 257/99 |
| 2007/0187807 A1 * | 8/2007 | Lee et al. | 257/676 |
| 2009/0032977 A1 * | 2/2009 | Yamaguchi | 257/787 |
| 2009/0127677 A1 * | 5/2009 | Gomez | 257/666 |
| 2009/0266593 A1 | 10/2009 | Karrer | |
| 2009/0309207 A1 * | 12/2009 | Chow et al. | 257/686 |

FOREIGN PATENT DOCUMENTS

| | | |
|---|---|---|
| CN | 101436575 A | 5/2009 |
| JP | H11167154 A | 6/1999 |
| JP | 2001298144 A | 10/2001 |
| JP | 2002026223 | 1/2002 |
| WO | 96/31891 | 10/1996 |
| WO | 2012040873 | 4/2012 |

* cited by examiner

LEADLESS CHIP CARRIER HAVING IMPROVED MOUNTABILITY

FIELD OF INVENTION

The embodiments of the present invention relate to semiconductor device packaging and, more particularly, to packaging having modifications that enhance the manufacturability and quality of products.

BACKGROUND

The electronics industry continues to rely upon advances in semiconductor technology to realize higher-function devices in more compact areas. For many applications realizing higher-functioning devices requires integrating a large number of electronic devices into a single silicon wafer. As the number of electronic devices per given area of the silicon wafer increases, the manufacturing process becomes more difficult.

Many varieties of semiconductor devices have been manufactured having various applications in numerous disciplines. Such silicon-based semiconductor devices often include metal-oxide-semiconductor field-effect transistors (MOSFET), such as p-channel MOS (PMOS), n-channel MOS (NMOS) and complementary MOS (CMOS) transistors, bipolar transistors, BiCMOS transistors. Such MOSFET devices include an insulating material between a conductive gate and silicon-like substrate; therefore, these devices are generally referred to as IGFETs (insulated-gate FET).

Each of these semiconductor devices generally includes a semiconductor substrate on which a number of active devices are formed. The particular structure of a given active device can vary between device types. For example, in MOS transistors, an active device generally includes source and drain regions and a gate electrode that modulates current between the source and drain regions.

Furthermore, such devices may be digital or analog devices produced in a number of wafer fabrication processes, for example, CMOS, BiCMOS, Bipolar, etc. The substrates may be silicon, gallium arsenide (GaAs) or other substrate suitable for building microelectronic circuits thereon.

The packaging of an IC devices is increasingly playing a role in its ultimate performance. Shortcomings in a particular package configuration may challenge the mounting process. For example, an IC component is placed onto to printed circuit board (PCB) and soldered on. The soldering process or package may cause the package not to lie flat on the PCB, the mounted package has substantial tilt. Furthermore, the quality of the soldering may not be visible on the finished populated PCB. Sending a PCB out into the field without the assurance of well-soldered (and well-observed) joint may pose a significant risk. This is of particular concern for IC devices subjected to harsh environmental conditions such as automotive or military applications in which extremes in temperature, humidity, mechanical stress are the norm. Field failure of a solder joint is not acceptable.

There is exists a need for a package with increased manufacturability and less susceptibility to tilting.

SUMMARY OF INVENTION

In the soldering of leadless chip carriers onto printed circuit boards, is necessary that the quality of the soldering be observable at the package terminals and that the carrier lie sufficiently flat. The present disclosure addresses these matters.

In an example embodiment, there is surface-mountable non-leaded chip carrier for a semiconductor device. The device comprises a first contact. A second contact is relative to the first contact; the second contact has a split therein to provide first and second portions of the second contact arranged relative to one another to lessen tilting of a soldering condition involving attachment of the chip carrier to a printed circuit board (PCB).

In another example embodiment, there is a small outline diode (SOD) package for surface mounting on a printed circuit board (PCB). The package comprises a first contact of a first length and width, having a bonding surface, a bottom mounting surface and a side mounting surface, the bonding surface having an area to which a diode die is attached; there is a second contact of a second length and width; the second contact is relative to the first contact, the second contact having a bonding surface, a bottom mounting surface, and a side mounting surface; the bonding surface has an area to which a bond wire is attached, the bond wire electrically coupling the diode die to the second contact. The second contact has a split therein to provide first and second portions of the second contact arranged relative to one another to lessen tilting of a soldering condition involving attachment of the chip carrier to the PCB. An encapsulation of molding compound envelopes the first contact and second contact, the side mounting surfaces of the first contact and second contact remain exposed, and the side mounting surfaces provides a visual indication of a the soldering condition.

In another example embodiment, semiconductor diode device is packaged in a small outline diode (SOD) package. the device comprises, a lead frame arranged in an array of die locations, each one of the die locations having, a first contact of a first length and width, having a bonding surface, a bottom mounting surface and a side mounting surface, the bonding surface having an area to which a diode die is attached; a second contact of a second length and width; the second contact is opposite to the first contact, the second contact has a bonding surface, a bottom mounting surface, and a side mounting surface, the bonding surface has an area to which a bond wire is attached; the bond wire electrically couples the diode die to the second contact; the second contact has a split therein to provide first and second portions of the second contact arranged relative to one another to lessen tilting of a soldering condition involving attachment of the chip carrier to the PCB. An encapsulation of molding compound envelopes the array of diode die locations. The lead frame is sawn between each die location in a first direction revealing a side mounting surface on the first contact and a side mounting surface of the second contact, the side mounting surface of the second contact having a corresponding split therein, the side mounting surfaces being flush with the encapsulation. Furthermore, the lead frame is electroplated with tin. The lead frame is sawn in a second direction, thereby separating the array of diode die locations into discrete diode devices. During installation onto a PCB, the side mounting surfaces of the discrete diode device provide an indication of the soldering condition.

In another example embodiment, there is a method for manufacturing small outline diode (SOD) package, the SOD package having a lead frame including, a first contact and a second contact opposite to the first contact, the second contact having a split therein to provide first and second portions of the second contact arranged relative to one another to lessen tilting of a soldering condition involving attachment of the chip carrier to a printed circuit board (PCB). The method comprises, providing a plurality of product die having a substrate connection and a wire bond connection; providing a plurality of lead frames; bonding the product die at the substrate connection onto the first contact of each lead frame and wire bonding the product die from wire bond connection to the second contact; encapsulating the plurality of product die and the plurality of lead frames in a molding compound; partially cutting the plurality of lead frames between each of the encapsulated product die; tin plating the exposed metal of the each lead frame of each product die; separating each encapsulated product die from one another; and testing each product die.

The above summaries of the present disclosure are not intended to represent each disclosed embodiment, or every aspect, of the present invention. Other aspects and example embodiments are provided in the figures and the detailed description that follow.

BRIEF DESCRIPTION OF THE DRAWINGS

The invention may be more completely understood in consideration of the following detailed description of various embodiments of the invention in connection with the accompanying drawings, in which.

Figure 1:
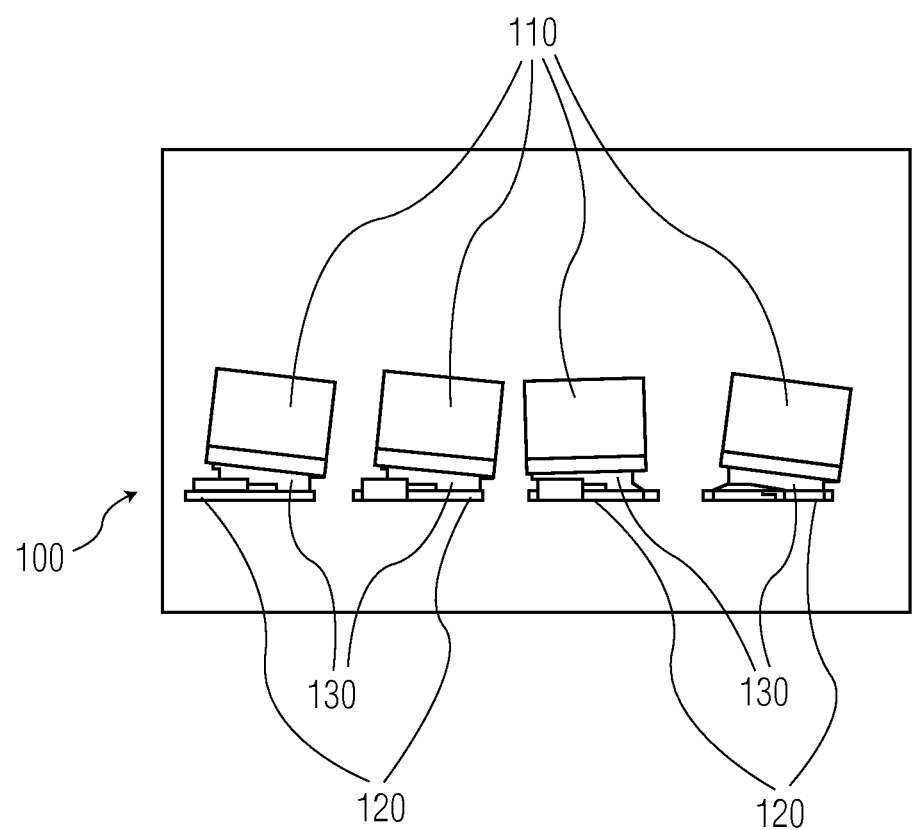
FIG. 1 (Prior Art) depicts several packages having substantial tilting after mounting.

While the invention is amenable to various modifications and alternative forms, specifics thereof have been shown by way of example in the drawings and will be described in detail. It should be understood, however, that the intention is not to limit the invention to the particular embodiments described. On the contrary, the intention is to cover all modifications, equivalents, and alternatives falling within the spirit and scope of the invention as defined by the appended claims.

DETAILED DESCRIPTION

The disclosed embodiments have been found useful in the surface mounting of leadless chip carriers onto printed circuit board (PCB) apparatus. During surface mounting it is desirable for the components to lie flat upon the PCB and the combination of the chip carrier and PCB be of a certain height profile. However, imperfections in the wetting of the solder may cause the leadless chip carriers to be tilted, resulting in a too high profile. Refer to FIG. 1. A group 100 of four devices 110 have been soldered onto a printed circuit board 120 and their solder profiles 130 have resulted in tilting and an uneven profile.

Figure 2:
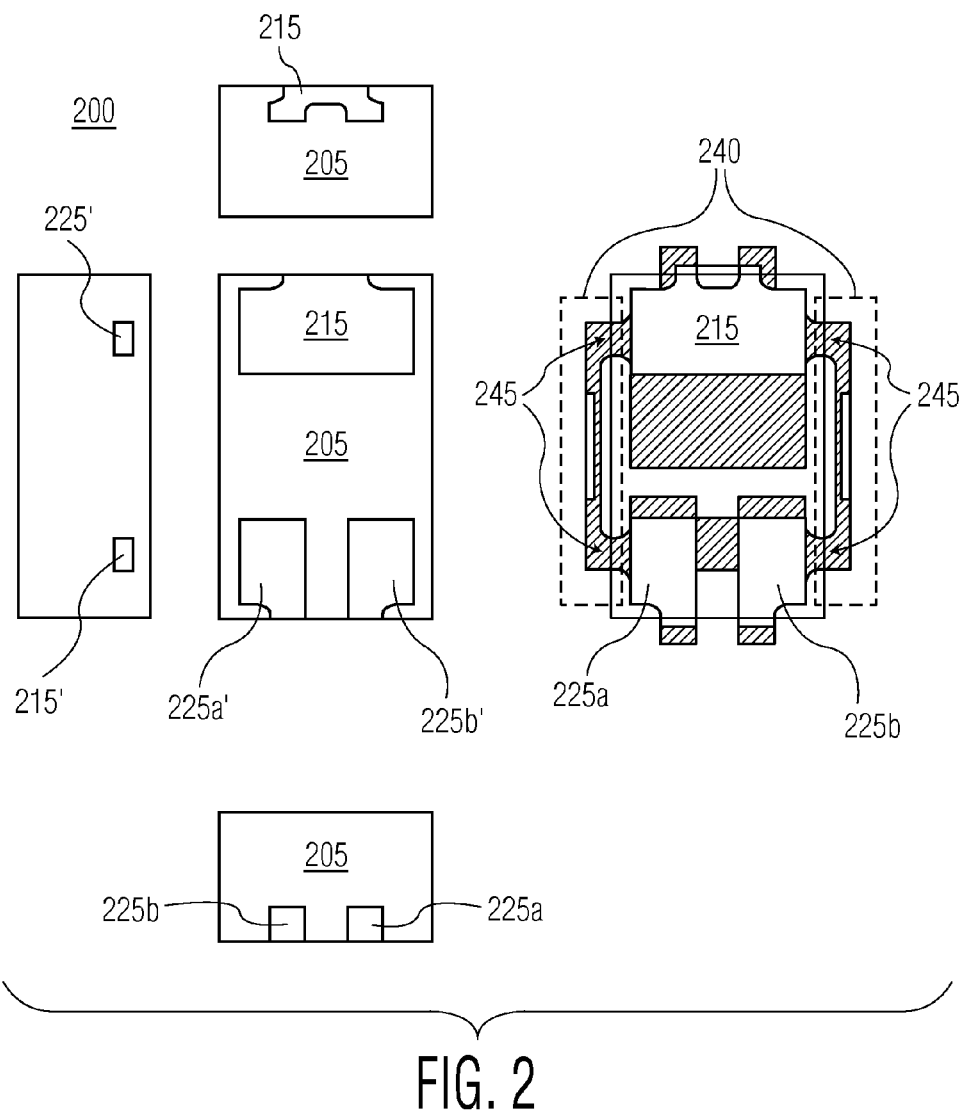
FIG. 2 is a line drawing of an example embodiment of a package according to the present disclosure

During a solder reflow process, when the solder melts, the solder heaps up under the package shown in FIG. 1, the component slides to one side and the solder hardens, resulting in tilting. In one embodiment, the potential for tilting is inhibited by a double lead (i.e., one with two pads separated). In this embodiment the solder is pulling at the sides, which reduces the amount of solder under the component. The pulling force enhances the anti-tilting effect of the side contacts. The remainder of the solder is divided between the two pads at the bottom. The surface tension of at both sides prevents the component from sliding in one direction With reference FIG. 2, in a dimensioned drawing, a package 200 according to an embodiment to the present disclosure is presented. On the underside of the package is a first contact 215 and a second contact 225' split into a first portion and a second portion 225a and 225b on the side mounted to a printed circuit board. On an opposite side the first portion 225a and second portion 225b are electrically coupled. Upon this opposite side an attachment area for wire bonding is provided. The boundary 205 (represents the encapsulation) such that a package height of <0.4 mm is attained. From a side view, contacts 225a and 225b are separated and visible. During attachment to the printed circuit board, the solder will wick from the bottom of the contacts 225a' and 225b' to the sides; likewise the solder will wick from the bottom of contact 215 to the side. Thus, the quality of the solder joints will be readily apparent from simple visual inspection. Note that in an example production process the package 200 would be in the form of a lead frame and be in quantities arranged in "tape and reel." Tabs 240, during assembly keep the contacts 215 and 225' in position for affixing a semiconductor die onto an attachment area on first contact 215. The semiconductor die is wire bonded from a die pad region on the die and coupled to the attachment area of contact 225'. The assembled die is encapsulated. After encapsulation the lead frame is separated at tabs 240 (as shown by the dashed lines and spaces 245. These show up as on the packaged die at contacts 215' and 225.'

Figure 3A:
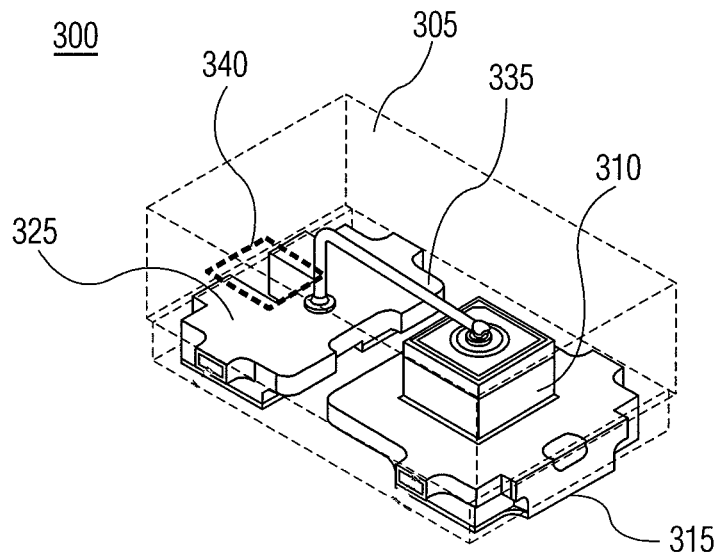
FIGS. 3A-3D depict an application of the package of FIG. 2.
Figure 3B:
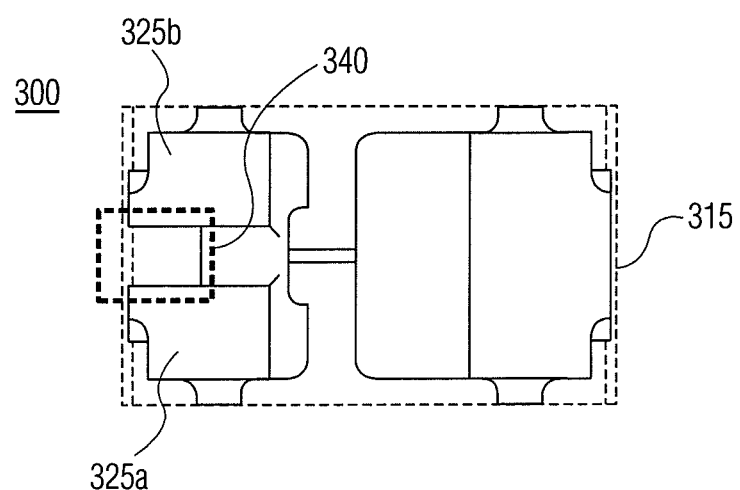

Refer to FIGS. 3A-3D. In an example embodiment according to the present disclosure, a small outline diode (SOD) package 300 is depicted in four perspectives. FIG. 3A depicts the SOD in a perspective view. A first contact 325 and a second contact 315 electrically couple the diode die 330 with a bond wire 335 and through direct connection (at a defined area 330) at the underside of diode die 310. Within an envelope 305 of molding compound the mounted diode die 310, and contacts 325, 315, are encapsulated. Refer to FIG. 3B, the second contact 315 is split into two portions. This feature reduces the likelihood of tilting when the SOD device is soldered onto a printed circuit board. Further note that the first contact 325 and second contact 315 have flanges that allow the molding compound to flow about them so as to increase the mechanical strength of the envelope 305. These SOD packages are arranged in lead frame arrays holding more than 8000 devices, divided over four areas (i.e., "mold caps"). Thus, during encapsulation, 8000 devices are enveloped in molding compound simultaneously.

Figure 3C:
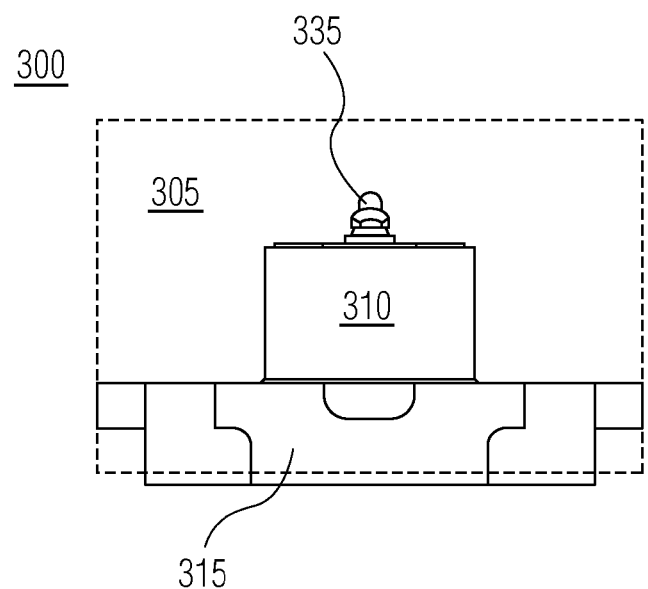
Figure 3D:
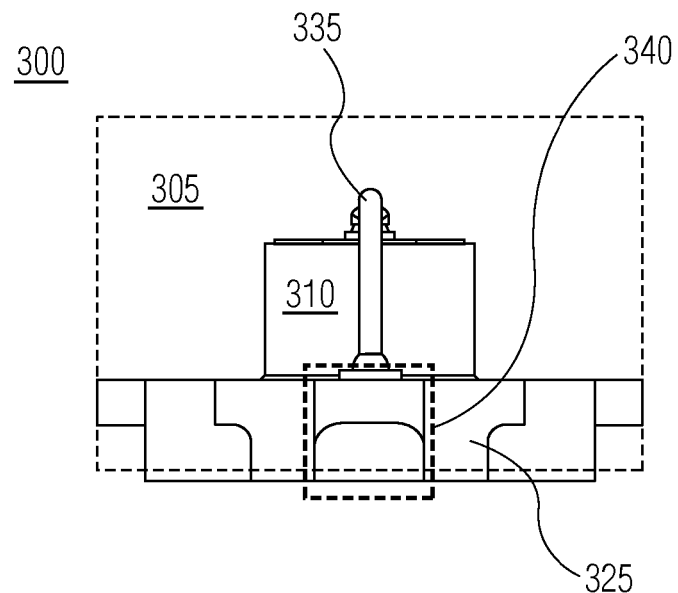

Refer to FIG. 3B and FIG. 3C. The first contact 325 as viewed from a first short side of the package 300, extends from the bottom of the package 300 partially upward on the side, flush with the encapsulation 305. Likewise, in FIG. 3D, the second contact 315, as viewed from a second short side, extends partially upward and flush with the encapsulation 305, as well. Note at the dashed line 340, the second contact has a first portion 325a and a second portion 325b.

So as to provide a solderable surface, the contacts are plated with tin or other suitable metal. When the SOD package is soldered to a PCB, during inspection one can easily see whether the quality of the soldering is sufficient. Previous packages in which the contacts were not visible from the sides would require complex X-ray scanning to evaluate the soldering.

The first contact and second contact during the mounting and encapsulation of a diode die 310 would be part of a lead frame assembly supplied to the user in the form of tape and reel. The cathode is on the underside of the diode die 310 and the anode is on the topside of the diode die 310. Each lead frame assembly would be joined to another at tabs which had previously joined contact 315' and 325'. After die mounting and encapsulation, the lead frame assembly would be "singulated," that is separated into separate SOD product.

Figure 4A:
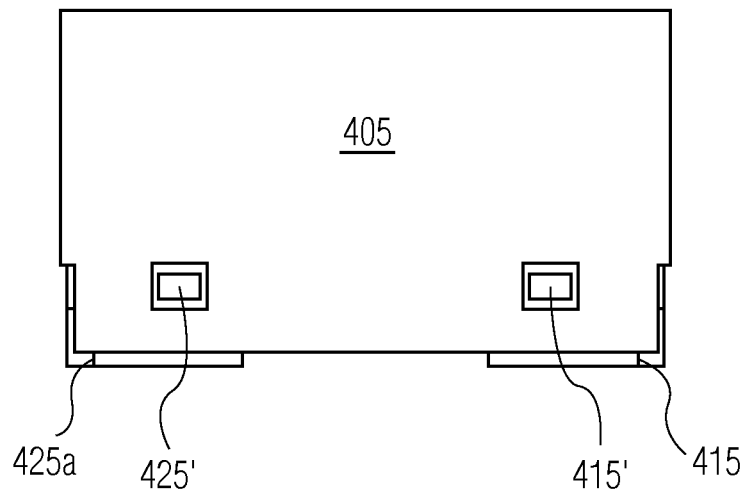
FIGS. 4A-4D depicts an example component encapsulated with black molding compound in the package of FIG. 2.
Figure 4B:
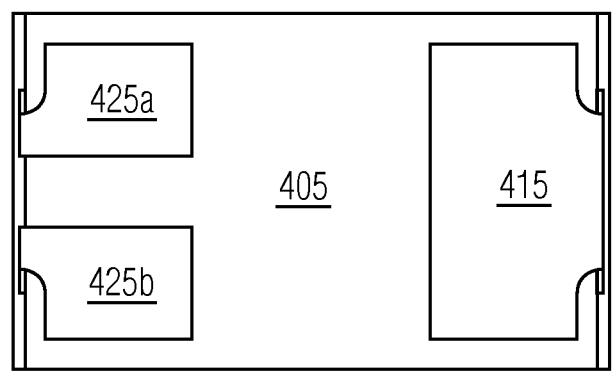
Figure 4C:
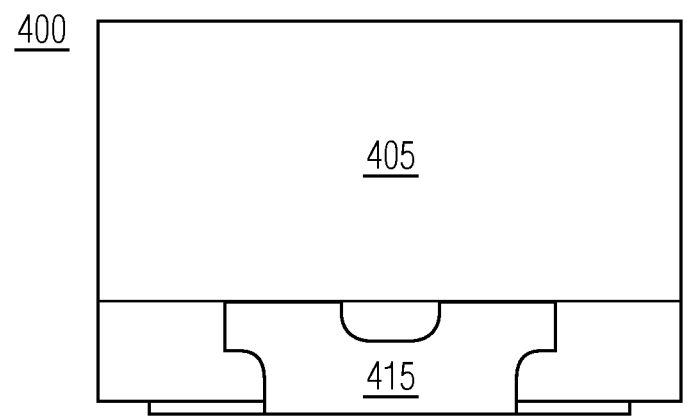
Figure 4D:
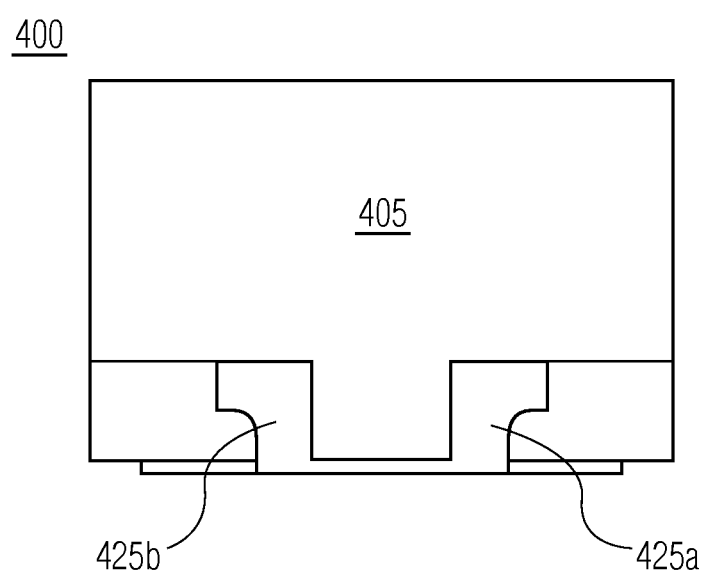

In an example embodiment according to the present invention, a diode die had been assembled in an SOD package. Refer to FIGS. 4A-4D. The long side view of FIG. 4A shows the areas 415' and 425' in which the lead frame (as mentioned in discussion with FIG. 2) and contacts 415 a contact portion 425a. The underside view of FIG. 4B depicts the contact 415 and contacts 425a and 425b. Short side views FIG. 4C and FIG. 4D show the contacts 415 and contacts 425a and 425b, respectively. These contacts extend upwards for a portion of the finished vertical height of the encapsulation 405. Furthermore, these contacts are flush with the encapsulation 405.

Figure 5:
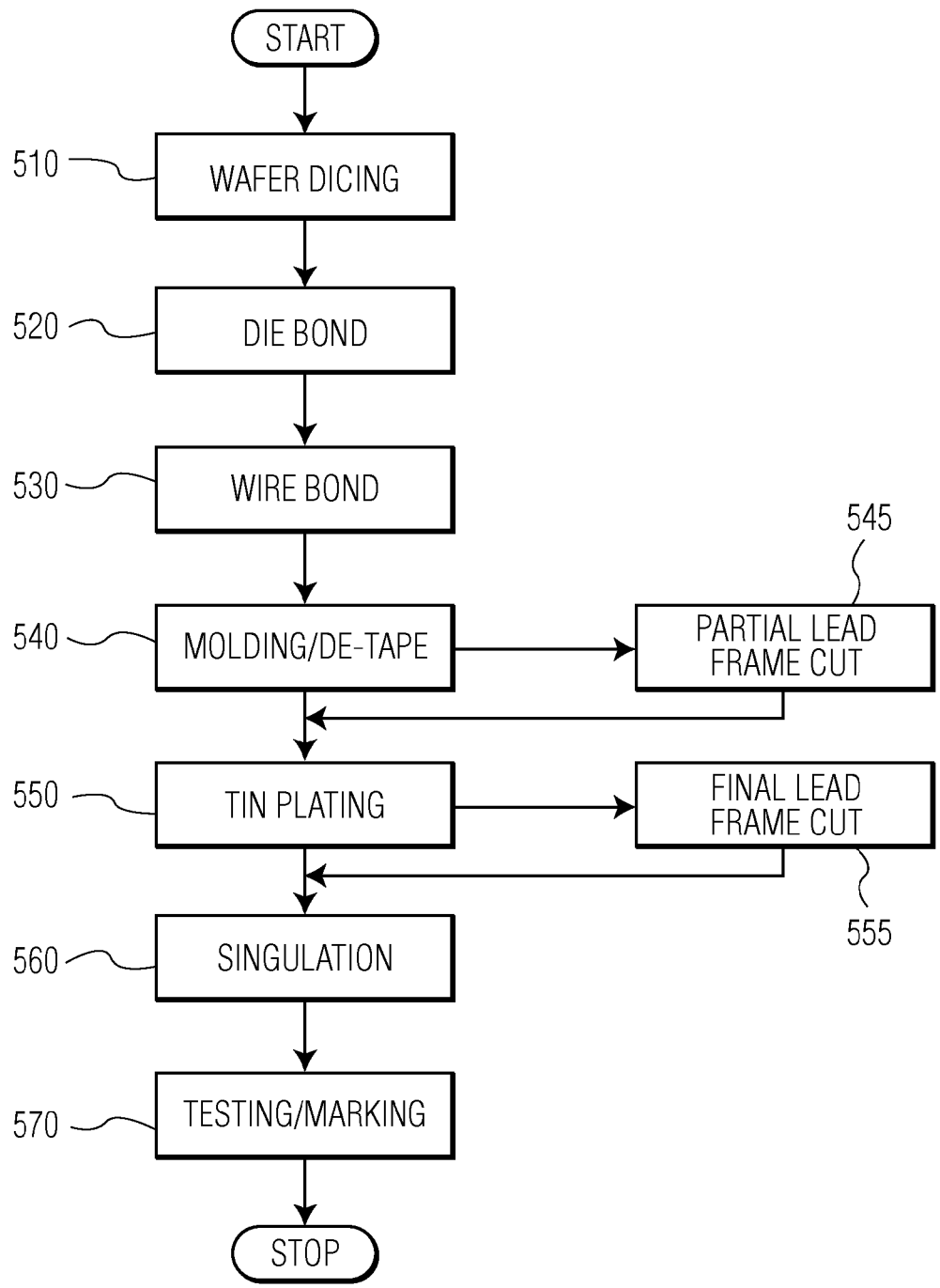
FIG. 5 depicts a flow diagram of an example assembly process for leadless packages according to an embodiment of the present disclosure.

In manufacturing the embodiments according to the present invention, an example process may be described in reference to FIG. 5. The process will often begin with the making of inventory of materials, such as lead frames (such as those described in reference to FIG. 2), epoxy glue for die attaching, gold wire for wire bonding, and molding compound for encapsulating. As with many modern manufacturing processes, these materials are inspected to see whether they meet vendor/manufacturer agreed upon quality standards. In an example process, the lead frames are delivered as strips having four frames per strip. Within each frame there are greater than 800 locations to which diodes can be mounted. Depending on process specifics, the strips may be combined to make a tape and reel with a plurality of frames.

The wafers of a product die, for example, diodes is received by the manufacturing line. Wafers undergo dicing 510 in which functional die are separated out from the duds. The diode dice are die bonded 520 to the lead frame. Incidentally, the lead frame may be delivered in a tape and reel format that holds thousands of individual lead frames (i.e., analogous to the single frames of motion picture film). The lead frame is made of a suitable metal. For example, copper is often used, but particular applications may use other metals and alloys (wherein the lead frame can be an alloy of NiPdAu). A bonding compound of a conductive epoxy may be used, but it is not limited to this particular type of attachment. In other processes, a eutectic die attach may be used. After die bonding 520, the epoxy glue is cured. After curing, the assembly is cleaned in a plasma. The die is wire bonded 530 to the lead frame from a defined bond pad on the diode die (bonding the diode cathode) to a defined bond pad on the lead frame (bonding the diode anode). After wire bonding 530, the assembly is again cleaned in a plasma. The die having been attached to the lead frame and wire bonded, the assembly is encapsulated in a molding compound 540. Tape on the contact side (underside) of the package keeps the molding compound from flowing onto the contacts. Therefore the leads are flush with the mold compound at the bottom. The molding compound undergoes a curing process.

Figure 6A:
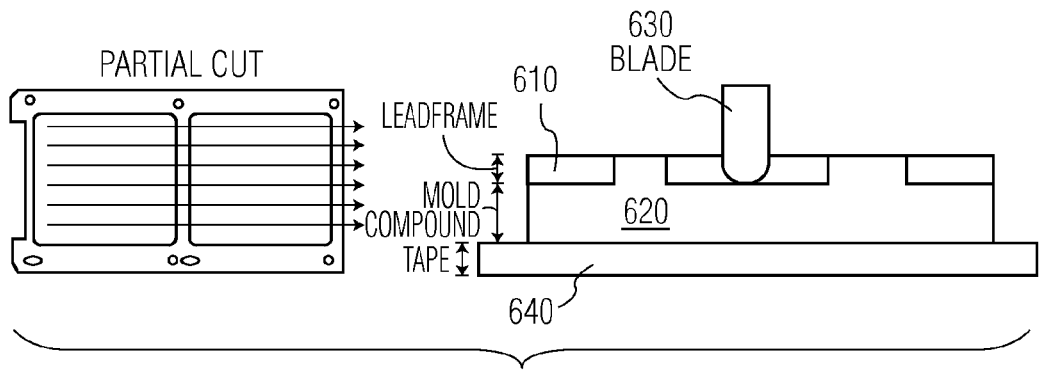
FIGS. 6A-6C depicts the sawing of an example lead frame undergoing the assembly process outlined in FIG. 5.
Figure 6B:
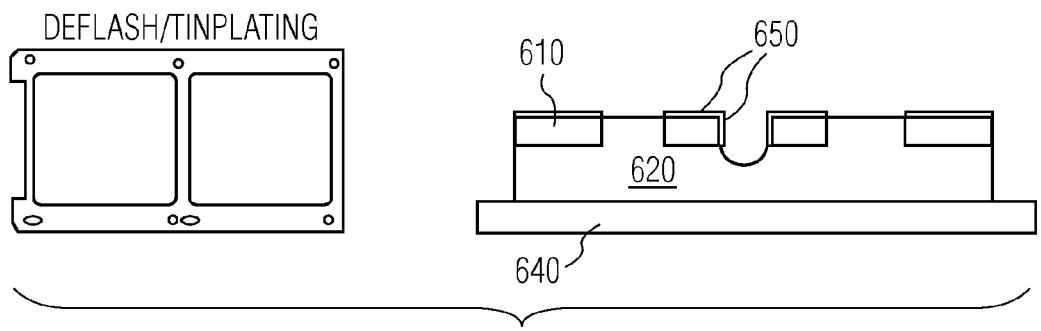
Figure 6C:
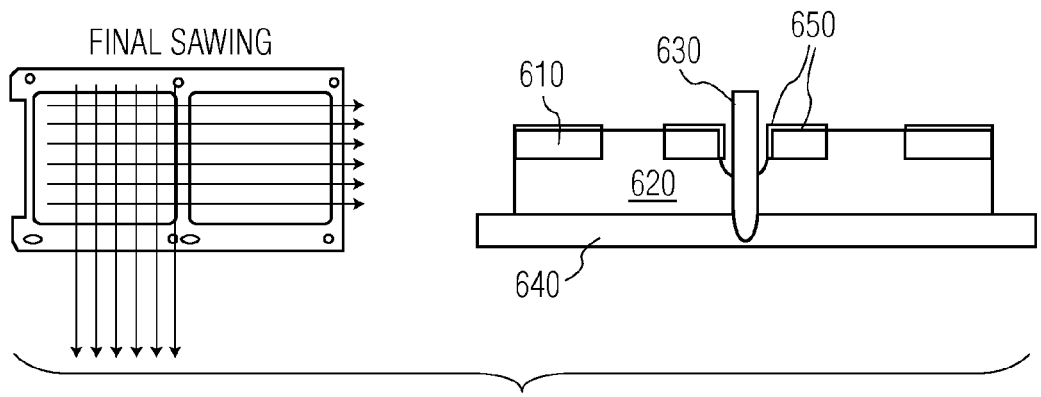

In an example process, after the molding 540, there is a plurality of devices on a strip of lead frames. Refer to FIGS. 6A-6C. To maintain stability of the lead frames during handling, a support tape 640 is applied to the plurality of devices after encapsulation 620 on the topside of the package. Prior to tin plating, the plurality of devices are prepared in a "partial cut" process 545. Between each device a saw 630 makes cut into the boundaries separating a first lead frame 610 adjacent to an additional lead frame in a first direction. The saw cuts completely through the contacts and just slightly into the molding compound 620. After sawing, a de-flashing process removes metal fragments, etc. from the lead frames. The underside surfaces and vertical surfaces of the first and second contacts are exposed for plating 650 with tin or other suitable metal which has soldering characteristics more suitable than that of bare copper. The encapsulated assembly's leads are plated with tin 550. Since only one cut had been made, the devices are still connected electrically with the neighbors and the complete lead frame in the other direction, and therefore electroplating of tin is possible. Furthermore, the structural integrity of the lead frames is maintained so that prior to electroplating, the support tape can be removed.

The leads having been plated, the devices are given a final lead cut 555 in both directions, the second cut to complete the partial cut and then a third cut in the perpendicular direction to the first and second cuts, as illustrated in FIG. 6C. The dice are then separated in a singulation process 560. The partial cut previously applied to the plurality of devices is finished off with a second cut 635 which completely passes through the devices' encapsulation and partially into the supporting tape 640. The singulated devices are sorted visually to cull those devices damaged during separation. Electrical testing and marking 570 of the assembled devices assures that devices shipped to an end user function.

Numerous other embodiments of the invention will be apparent to persons skilled in the art without departing from the spirit and scope of the invention as defined in the appended claims.

The invention claimed is:

1. A surface-mountable non-leaded chip carrier for a semiconductor device, comprising:
   a first contact;
   a die mounted on the first contact and electrically coupled thereto; and
   a second contact spaced apart from the first contact, the second contact having a thickness extending from one side of the second contact to an opposing side of the second contact, being electrically coupled to the die via a bond wire and having a split therein that extends entirely through the thickness of the second contact at a first portion thereof, and that extends partially through the thickness of the second contact at a second portion thereof, and divides the second contact into contiguous first and second portions configured and arranged to provide solder-connection areas for attachment of the chip carrier to a printed circuit board (PCB) and configured and arranged relative to one another to lessen tilting of a soldering condition involving the attachment of the chip carrier to the PCB, the first and second portions of the second contact configured and arranged with opposing surface areas that are adjacent to the solder-connection areas and that manifest solder thereon due to the soldering condition.

2. The chip carrier as recited in claim 1, wherein the first contact and the second contact are encapsulated in a molding compound, the molding compound formed into a substantially rectangular shape bounding the first contact and second contact;
   each of the first contact and the second contact includes flanges configured and arranged to promote flow of the molding compound around the first contact and the second contact;
   the first contact has a vertical surface exposed on the molding compound; and
   the second contact has a vertical surface exposed on the molding compound, the vertical surface of the second contact having the split therein.

3. The chip carrier as recited in claim 1, wherein the split separating the first and second portions of the second contact provides the opposing surface areas of the first and second portions, and the chip carrier further including solder on and configured and arranged with the solder-connection areas to couple the solder-connection areas to the PCB.

4. The chip carrier as recited in claim 3, wherein the split of the second contact is configured and arranged to wick solder from a bottom portion of the second contact to a side portion of the second contact.

5. The chip carrier as recited in claim 3, wherein the solder at the opposing surface areas of the first and second portions have substantially equal surface tension.

6. The chip carrier as recited in claim 1, wherein
   the second contact is configured and arranged to wick solder from a bottom portion of the second contact to a side portion of the second contact,
   the side portion of the second contact is configured and arranged adjacent to the solder-connection areas and with solder thereon due to the soldering condition, and
   the solder on the side portion is configured and arranged to further lessen tilting of the soldering condition involving the attachment of the chip carrier to the PCB, by increasing surface tension of the solder and pulling the side portion of the second contact toward the PCB.

7. A small outline diode (SOD) package for surface mounting on a printed circuit board (PCB) comprising:
   a first contact of a first length and width, having a bonding surface, a bottom mounting surface and a side mounting surface, the bonding surface having an area to which a diode die is attached;
   a second contact of a second length and width, the second contact is opposite to the first contact, the second contact having a bonding surface, a bottom mounting surface to provide solder-connection areas for attachment to a printed circuit board (PCB), and a side mounting surface, the bonding surface having an area to which a bond wire is attached, the bond wire electrically coupling the diode die to the second contact;
   the second contact having a thickness extending from one side of the second contact to an opposing side of the second contact and having a split that extends entirely through the thickness of the second contact at a first portion thereof, that extends partially through the thickness of the second contact at a second portion thereof, and that divides the second contact into contiguous first and second portions arranged relative to one another and configured and arranged to lessen tilting of a soldering condition involving attachment to the PCB; and
   an encapsulation of molding compound enveloping the first contact and second contact, the side mounting surfaces of the first contact and second contact remaining exposed, the side mounting surfaces configured and arranged adjacent to the solder-connection areas and with solder thereon due to the soldering condition.

8. The SOD package as recited in claim 7, wherein the split separating the first and second portions of the second contact provides opposing side mounting surface areas of the first and second portions, and each of the first contact and the second contact includes flanges configured and arranged to promote flow of the molding compound around the first contact and the second contact.

9. The SOD package as recited in claim 8, where the opposing side mounting surface areas are spaced to wick excess solder from under the first and second contacts during the process of attachment of the SOD package to a printed circuit board (PCB).

10. The SOD package as recited in claim 8, further including solder on and configured and arranged with the solder-connection areas to couple the solder-connection areas to the PCB, and wherein the solder at the opposing side mounting surface areas of the first and second portions have substantially equal surface tension.

11. The SOD package as recited in claim 7, wherein the first contact and the second contact are plated with tin.

12. A semiconductor diode device packaged in a small outline diode (SOD) package, the device comprising:
   a lead frame arranged in an array of die locations, each one of the die locations having,
      a first contact of a first length and width, having a bonding surface, a bottom mounting surface and a side mounting surface, the bonding surface having an area to which a diode die is attached;
      a second contact of a second length and width and a thickness extending from one side of the second contact to an opposing side of the second contact, the second contact is opposite to the first contact, the second contact having a bonding surface, a bottom mounting surface, and a side mounting surface, the bonding surface having an area to which a bond wire is attached, the bond wire electrically coupling the diode die to the second contact, the second contact having a split therein to provide contiguous first and second portions of the second contact arranged relative to one another to lessen tilting of a soldering condition involving attachment to a printed circuit board (PCB),
   an encapsulation of molding compound enveloping the array of die locations;
   wherein the lead frame is sawn between each die location in a first direction revealing a side mounting surface on the first contact and a side mounting surface of the second contact, the side mounting surface of the second contact having a corresponding split therein that extends entirely through the thickness of the second contact at a first portion thereof, that extends partially through the second contact at a second portion thereof, and that divides the second contact into contiguous first and second portions, the side mounting surfaces being flush with the encapsulation;
   wherein the lead frame is electroplated with tin;
   wherein the lead frame is sawn in a second direction, thereby separating the array of die locations into discrete diode devices; and
   wherein during installation onto a PCB, the side mounting surfaces of the discrete diode device provide an indication of the soldering condition.

13. The semiconductor diode device as recited in claim 12, wherein the lead frame is arranged into a frame of four quadrants of 500 locations each, and each of the first contact and the second contact includes flanges configured and arranged to promote flow of the molding compound around the first contact and the second contact.

14. The semiconductor device diode as recited in claim 12, wherein the lead frame includes an alloy of NiPdAu.

15. The semiconductor device diode as recited in claim 12, wherein the lead frame is arranged as a plurality of frames.

* * * * *